United States Patent [19]

Furukawa

[11] Patent Number: 4,899,110
[45] Date of Patent: Feb. 6, 1990

[54] MAGNETIC RESONANCE IMAGING APPARATUS WITH STABILIZED MAGNETIC FIELD

[75] Inventor: Hiroshi Furukawa, Otawara, Japan
[73] Assignee: Kabushiki Kaisha Toshiba, Kawasaki, Japan
[21] Appl. No.: 274,577
[22] Filed: Nov. 22, 1988
[30] Foreign Application Priority Data
Nov. 25, 1987 [JP] Japan .................................. 62-295362
[51] Int. Cl.$^4$ ........................................... G01R 33/20
[52] U.S. Cl. ..................................................... 324/320
[58] Field of Search ............... 324/313, 318, 320, 307; 335/216, 299

[56] References Cited
U.S. PATENT DOCUMENTS

| | | | |
|---|---|---|---|
| 4,523,166 | 6/1985 | Gross | 324/320 |
| 4,623,844 | 11/1986 | Macovski | 324/313 |
| 4,652,826 | 3/1987 | Yamamoto et al. | 324/320 |
| 4,683,434 | 7/1987 | Tschopp | 324/320 |
| 4,724,412 | 2/1988 | Kalafala | 324/320 |
| 4,761,614 | 8/1988 | Prammer et al. | 324/320 |
| 4,812,797 | 3/1989 | Jayakumar | 324/320 |

OTHER PUBLICATIONS
Nuclear Magnetic Resonance NMR Imaging, C. Leon Partain et al, 1983, pp. 115–121.

Primary Examiner—Michael J. Tokar
Assistant Examiner—Kevin D. O'Shea
Attorney, Agent, or Firm—Foley & Lardner, Schwartz, Jeffery, Schwaab, Mack, Blumenthal & Evans

[57] ABSTRACT

In a magnetic resonance imaging apparatus having a superconducting magnet to form a static magnetic field and capable of producing a magnetic resonance image of a test piece placed in the static magnetic field, a static magnetic field correcting coil corrects the intensity of the static magnetic field, and a power source supplies to the coil a current to form a magnetic field having inverse characteristics with respect to the attenuation pattern of the static magnetic field intensity in the superconducting magnet. Since the static magnetic field correcting coil is supplied with such a current, enhances the stability of the static magnetic field at the time of raising such a magnetic field or immediately after changing the intensity thereof.

10 Claims, 3 Drawing Sheets

FIG.2
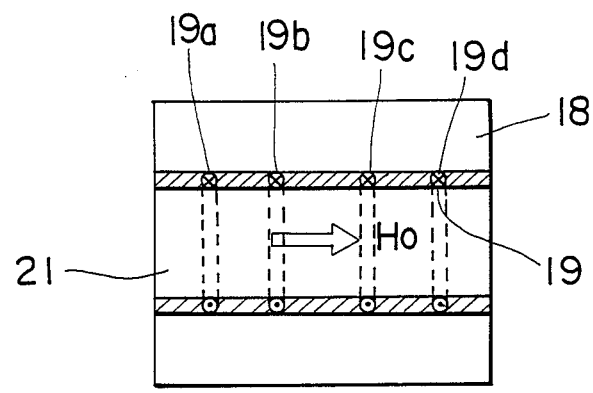
FIG.3A
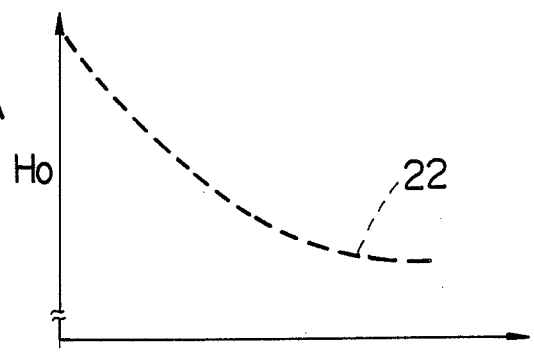
FIG.3B
FIG.3C
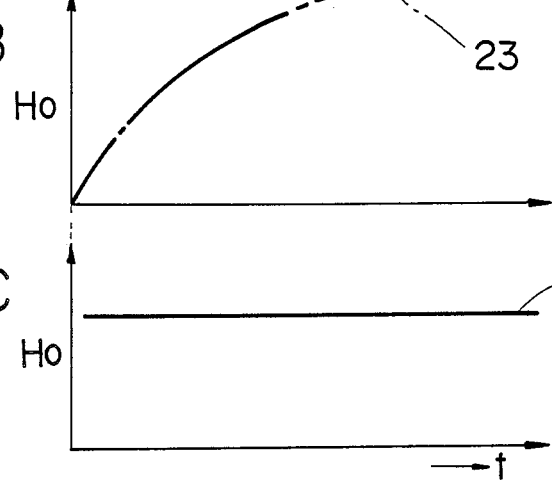

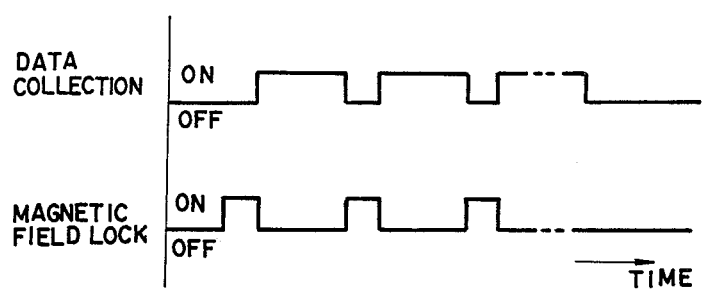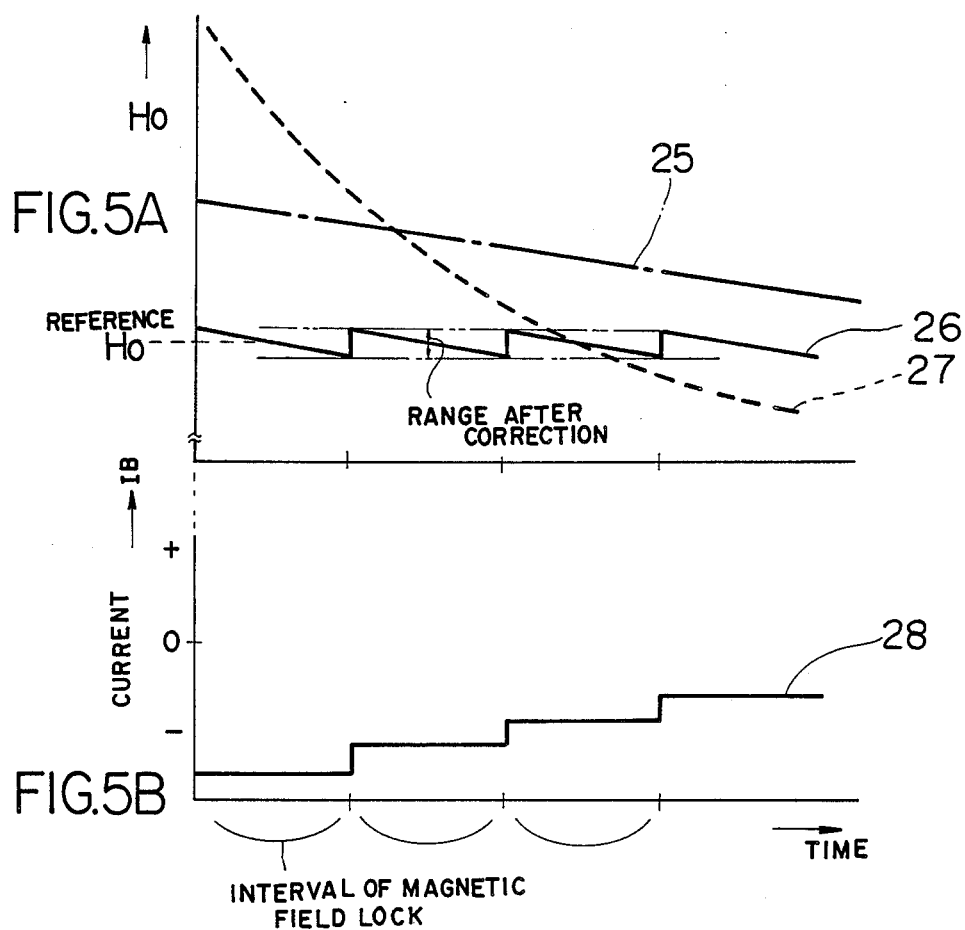

MAGNETIC RESONANCE IMAGING APPARATUS WITH STABILIZED MAGNETIC FIELD

BACKGROUND OF THE INVENTION

1. Field of the Invention

The present invention relates to a magnetic resonance imaging apparatus for producing a magnetic resonance image of a test piece by utilizing the phenomenon of magnetic resonance and, more particularly, to an improved apparatus designed to stabilize the static magnetic field applied therein.

2. Description of the Prior Art

In the magnetic resonance imaging apparatus (hereinafter referred to as MRI apparatus), a uniform static magnetic field is applied to a desired region of a test piece, so that magnetic resonance is caused merely in a specific slice portion, where a sectional image thereof is to be obtained, by a transmitting coil to form a radio-frequency magnetic field orthogonally to the static magnetic field, and the MR signal generated from the atomic nuclei after removal of such a radio-frequency magnetic field is detected by means of a receiving coil. In such a structure, a gradient magnetic field having a linear inclination to the X'-axis (coordinate system with rotation of an angle $\theta°$ from the X-axis) is exerted on the static magnetic field to obtain a composite MR signal, and a desired MR image can be formed on the basis of such a composite signal.

In the MRI apparatus mentioned, it is necessary for the static magnetic field to retain satisfactory uniformity in a wide range as well as to maintain high stability. For example, in ordinary proton imaging, the requirement regarding the stability of the static magnetic field is merely 2 ppm/H or so; whereas in chemical shift imaging, the required stability is as high as 0.1 ppm/H. In the case of a superconducting magnet device where a static magnetic field is generated in a superconductive state, a high stability of 0.1 ppm/H is achievable relatively easily under a steady condition. However, at the time of raising the static magnetic field or immediately after changing the intensity thereof, it is extremely difficult to attain the desired stability of 0.1 ppm/H because of intensity attenuation.

Although such attenuation of the static magnetic field intensity can be corrected in a normal conducting magnet device by controlling the current fed to the coil, the correction is impossible in a superconducting magnet device due to adoption of a permanent mode where the device is usually operated with the power source disconnected therefrom.

SUMMARY OF THE INVENTION

In conventional MRI apparatus using a superconducting magnet device as mentioned above, there exists a problem that a sufficiently high stability of the static magnetic field fails to be achieved at the time of raising the static magnetic field or immediately after changing the intensity thereof.

The present invention obviates the known drawbacks observed in the prior art. An object of the present invention is to provide an improved MRI apparatus which is capable of enhancing the stability of a static magnetic field at the time of raising such a magnetic field or immediately after changing the intensity thereof in a superconducting magnet device With regard to a magnetic resonance imaging apparatus including a superconducting magnet device to generate a static magnetic field in a superconductive state for producing a magnetic resonance image of a test piece placed in such a static magnetic field, a feature of the present invention resides in a novel constitution comprising a coil for correcting the intensity of the static magnetic field, and a field corrective power source for supplying to the coil a current adequate for generating a magnetic field which has inverse characteristics with respect to the attenuation pattern of the static magnetic field intensity in the superconducting magnet device.

In the present invention, a current adapted to generate an inverse-characteristic magnetic field with respect to the field intensity attenuation pattern in the superconducting magnet device is supplied to the aforesaid coil to carry out proper correction of the static magnetic field intensity, thereby enhancing the stability of the static magnetic field at the time of raising such a field or immediately after changing the intensity thereof.

BRIEF DESCRIPTION OF THE DRAWINGS

FIG. 2 illustrates a principal constitution of the apparatus shown in FIG. 1; and FIGS. 3A through 5B are characteristic diagrams and timing charts for explaining the operation of the embodiment according to the present invention.

DETAILED DESCRIPTION OF THE PREFERRED EMBODIMENT

Figure 1:
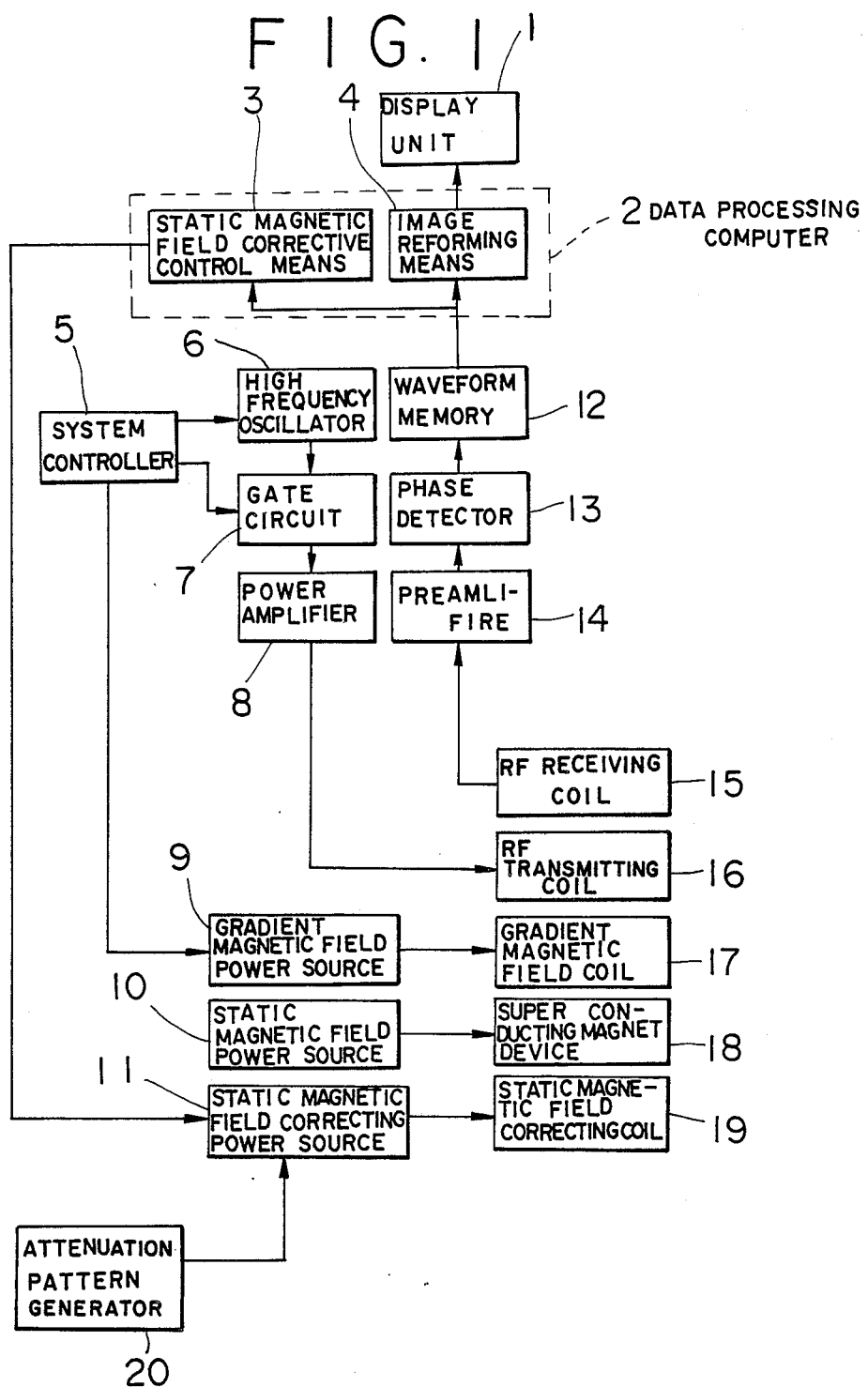
FIG. 1 is a block diagram of an exemplary MRI apparatus embodying the present invention.

In FIG. 1, showing an exemplary embodiment of an MRI apparatus according to the present invention, a high frequency oscillator 6 generates a radio frequency (RF) signal under control of a system controller 5. The output of the oscillator 6 is fed to an RF transmitting coil 16 via a gate circuit 7 and a power amplifier 8 disposed in the following stages. An RF receiving coil 15 serves to detect an MR signal from a test piece, and the MR signal thus detected by the RF receiving coil 15 is introduced via a preamplifier 14 to a phase detector 13 where the signal phase is detected. The phase-detected output therefrom is then introduced to a data processing computer 2 via a waveform memory 12 disposed in the next stage. The data processing computer 2 functionally comprises a static magnetic field corrective control means 3 and an image reforming means 4.

The static magnetic field corrective control means 3 carries out corrective control of the static magnetic field intensity by controlling the current in a static magnetic field correcting coil 19 in accordance with variation of the static magnetic field intensity. The field intensity can be calculated by, for example, executing Fourier conversion of the MR signal and detecting its peak value. Then the control means 3 utilizes the difference between the field intensity thus calculated by the above method and the preset field intensity corresponding to a reference MR frequency $f_O$, to control the current in the coil 19 via the field correcting power source 11 so as to eliminate such a difference.

Meanwhile the image reforming means 4 serves to reform the MR image on the basis of the MR information outputted from the waveform memory 12, and then the reformed MR image is fed to a display unit 1 so as to be rendered visible.

A gradient magnetic field coil 17 for generating a gradient magnetic field to be superposed on the static magnetic field comprises three coil elements which respectively generate a magnetic field $G_S$ inclined in the slicing direction, a magnetic field $G_E$ inclined in the encoding direction, and a magnetic field $G_R$ inclined in the reading direction. The gradient magnetic field power source 9 supplies a required current to the gradient magnetic field coil 17 and operates under control of the system controller 5.

A superconducting magnet device 18 for generating a static magnetic field in a superconductive state comprises a static magnetic field coil composed of a superconductor material and a means for cooling such a coil. Cooling the static magnetic field coil is carried out by the use of liquid helium, liquid nitrogen or the like.

An attenuation pattern generator 20 generates an attenuation pattern of the static magnetic field produced by the superconducting magnet device 18, and it can be composed of a memory or the like which stores therein the attenuation pattern information acquired previously by actual measurement. The attenuation pattern information obtained from the pattern generator 20 is fed to the static magnetic field correcting power source 11, which then supplies to the coil 19 a current based on such information and adequate to form a magnetic field having inverse characteristics with respect to the attenuation pattern. Subsequently the current supplied from the static magnetic field power source 11 to the coil 19 is controlled by the static magnetic field corrective control means 3 described previously.

FIG. 2 illustrates the positional relationship between the superconducting magnet device 18 and the static magnetic field correcting coil 19.

The superconducting magnet device 18 is shaped substantially cylindrical, and the static magnetic field correcting coil 19 is internally disposed in contact therewith. The correcting coil 19 includes four loop coils 19a, 19b, 19c and 19d which are arranged in the direction of the static magnetic field and are connected in series with one another. Such an arrangement is derived from the fact that two loop coils (Helmholtz coils) are insufficient for changing the static magnetic field intensity while maintaining a state of high uniformity, and at least four or more coils are needed. Denoted by 21 is a photographing aperture, and a test piece is to be set in a static magnetic field $H_O$ formed in aperture 21. Although omitted for the sake of simplifying the explanation, the gradient magnetic field coil 17, the RF transmitting coil 16 and the RF receiving coil 15 are molded together with or separately from the static magnetic field correcting coil 19 and are disposed inside the coil 19.

Now a description will be given with regard to the operation performed in the embodiment having the constitution described above.

The current from the static magnetic field power source 10 is supplied to the superconducting magnet device 18, and subsequently the power source 10 is disconnected so that the superconducting magnet device 18 is placed in the permanent mode. The collection of data is carried out under control of the system controller 5. RF pulses are transmitted from the coil 16 in a predetermined pulse sequence to execute the data collection for reforming the MR image, and the gradient magnetic field generated by the coil 17 is superimposed on the static magnetic field. The MR signal from the test piece is detected by the RF receiving coil 15 and is then introduced via the preamplifier 14 to the phase detector 13, where the signal phase is detected. The phase-detected output therefrom is fed via the waveform memory 12 to the image reforming means 4, and the MR signal reformed therein is visually represented on the display unit 1.

The correction of the static magnetic field intensity is performed in the following manner.

Supposing now that the static magnetic field intensity ($H_O$) obtained from the superconducting magnet device 18 is attenuated as indicated by a curve 22 in FIG. 3A, the attenuation pattern information is fed from the attenuation pattern generator 20 to the static magnetic field correcting power source 11. Then a current adequate for forming an inverse-characteristic magnetic field, indicated by a curve 23 in FIG. 3B, with respect to the attenuation pattern is supplied from the power source 11 to the static magnetic field correcting coil 19, whereby the intensity of the static magnetic field is corrected and rendered stable as indicated by a curve 24 in FIG. 3C.

Forming such a magnetic field of inverse characteristics with respect to the attenuation pattern of the static magnetic field is effective to enhance the stability of the static magnetic field at the time of raising such a field or immediately after changing its intensity. However, there may occur some difference between the actual static magnetic field intensity and the preset intensity corresponding to the reference MR frequency $f_O$. In such a case, the difference can be eliminated by controlling the current in the coil 19 by the following procedure.

First the MR signal obtained from the test piece is detected under control of the system controller 5. Then the MR signal is processed through Fourier conversion in the static magnetic field corrective control means 3, and the intensity of the static magnetic field is calculated in accordance with the peak value of the converted signal. Subsequently a calculation is executed to find the difference existing between actual field intensity and the preset intensity corresponding to the reference MR frequency $f_O$, and the current in the coil 19 is controlled through the power source 11 in such a manner as to eliminate the difference. Thus the intensity of the static magnetic field is corrected by the above operation which is termed magnetic field lock.

The timing to carry out such a magnetic field lock can be determined properly by taking into consideration the amount of attenuation of the static magnetic field intensity so that the required field stability is attained. However, when the photographing time (data collection time) is long, it may be divided at predetermined time intervals with a non-photographing period (off-time) included as graphically shown in FIG. 4, and the magnetic field lock mode may be inserted in such off-time. FIGS. 5A and 5B graphically show the relationship between the change in the current of the static magnetic field correcting coil 19 and the change caused in the intensity of the static magnetic field. In these graphs, $H_O$ represents the intensity of the static magnetic field, and $I_B$ represents the current flowing in the static magnetic field correcting coil 19. When no correction is executed for the static magnetic field intensity, a great intensity attenuation is induced as indicated by a curve 27 in FIG. 5A; whereas forming the inverse-characteristic magnetic field with respect to the attenuation pattern of the static magnetic field is effective to correct the static magnetic field intensity as indicated by a curve 25 in FIG. 5A. Furthermore, since the current in the static magnetic field correcting coil 19 is also controlled by the field corrective control means 3 (in the magnetic field lock mode), high stability can be accomplished in the vicinity of the reference $H_O$ (static magnetic field intensity corresponding to the reference MR frequency $f_O$) as indicated by a curve 26 in FIG. 5A.

It is preferred that, as indicated by a solid line 28 in FIG. 5B, the current IB is set to be negative at the time of raising the static magnetic field or immediately after changing its intensity, and to become zero in the steady state of the apparatus. Such a setting is effective in minimizing the required power supplied to the static magnetic field correcting coil 19.

As described hereinabove, according to the apparatus of the present invention where a current adequate for forming a magnetic field of inverse characteristic with respect to the attenuation pattern of the static magnetic field in the superconducting magnet device 18 is supplied to the static magnetic field correcting coil 19, it becomes possible to enhance the stability of the static magnetic field at the time of raising such a magnetic field or immediately after changing the intensity thereof. Furthermore, since the current in the coil 19 is also controlled in accordance with any variation caused in the static magnetic field intensity, high stability is realized in the vicinity of the field intensity corresponding to the reference MR frequency $f_O$.

Although a description has been given hereinabove merely with regard to one exemplary embodiment of the present invention, it is to be understood that the invention is not limited to such an embodiment alone and may be applicable to a variety of modifications as well.

What is claimed is:

1. A magnetic resonance imaging apparatus having a superconducting magnet to form a static magnetic field in a superconductive state and capable of producing a magnetic resonance image of a test piece placed in said static magnetic field, said magnetic resonance imaging apparatus comprising:
   a coil compensating for an intensity of said static magnetic field;
   an attenuation pattern generator generating an attenuation pattern of said intensity of said static magnetic field in said superconducting magnet; and
   a static magnetic field correcting power source outputting a current for forming a magnetic field having inverse characteristics with respect to said attenuation pattern, wherein an output of said static magnetic field correcting power source is supplied to said coil.

2. A magnetic resonance imaging apparatus according to claim 1, wherein said attenuation pattern generator has a memory to store attenuation pattern information describing said static magnetic field acquired by previous measurement.

3. A magnetic resonance imaging apparatus according to claim 1, wherein said coil includes a plurality of loop coils arranged to generate fields parallel or antiparallel to the direction of said static magnetic field and connected in series with one another.

4. A magnetic resonance imaging apparatus according to claim 1, wherein said static magnetic field correcting power source is controlled by a static magnetic field corrective control means for generating an output to compensate for variation in said intensity of said static magnetic field.

5. A static magnetic field stabilizer for a magnetic resonance apparatus, said static magnetic field stabilizer comprising:
   a memory storing attenuation pattern information, said attenuation pattern information representing decay of a first magnetic field, generated by a superconducting magnet, over time; and
   a correcting coil generating a second magnetic field superimposed on said first magnetic field, said second magnetic field compensating for decay of said first magnetic field such that decay of a net magnetic field experienced by a subject in said magnetic resonance apparatus is lessened.

6. A static magnetic field stabilizer as set forth in claim 5, further comprising:
   a power source providing current to said correcting coil for compensating for decay of said first magnetic field.

7. A static magnetic field stabilizer as set forth in claim 6, further comprising:
   a control circuit providing control signals to said power source to minimize a difference between said net magnetic field intensity and a preset magnetic field intensity.

8. A method of stabilizing a magnetic field experienced by a subject in a magnetic resonance apparatus, comprising the steps of:
   storing in a memory attenuation pattern information representing decay of a first magnetic field, generated by a superconducting magnet, over time; and
   generating a second magnetic field superimposed on said first magnetic field, said second magnetic field compensating for decay of said first magnetic field such that decay of a net magnetic field is lessened.

9. A method as set forth in claim 8, further comprising the step of:
   supplying current to a coil from a power source to generate said second magnetic field.

10. A method as set forth in claim 9, further comprising the step of:
    controlling said power source to minimize a difference between a net magnetic field intensity and a preset magnetic field intensity.

* * * * *

UNITED STATES PATENT AND TRADEMARK OFFICE
CERTIFICATE OF CORRECTION

PATENT NO. : 4,899,110
DATED : February 6, 1990
INVENTOR(S) : Hiroshi FURUKAWA

It is certified that error appears in the above—identified patent and that said Letters Patent is hereby corrected as shown below:

Column 1, line 14, delete "the".

Column 1, line 66, after "device" insert a period --.--.

Column 5, line 10, "IB" should read --$I_B$--.

Signed and Sealed this

Eleventh Day of February, 1992

Attest:

HARRY F. MANBECK, JR.

Attesting Officer     Commissioner of Patents and Trademarks